United States Patent
Mossig et al.

[11] Patent Number: 6,154,709
[45] Date of Patent: Nov. 28, 2000

[54] METHOD FOR DETERMINING THE LOAD CAPACITY OF AN AC NETWORK

[75] Inventors: Kai Mossig, Baden, Switzerland; Peter Terwiesch, Edingen-Neckarhausen, Germany

[73] Assignee: DaimlerChrysler AG, Stuttgart, Germany

[21] Appl. No.: 09/149,173

[22] Filed: Sep. 8, 1998

[30] Foreign Application Priority Data

Sep. 9, 1997 [DE] Germany .......................... 197 39 379

[51] Int. Cl.⁷ .................................................. G01R 19/00
[52] U.S. Cl. .................. 702/60; 702/64; 702/72; 307/11; 307/52; 323/212; 323/352; 373/60
[58] Field of Search ................................. 702/60, 62, 64, 702/72; 307/52, 60, 62, 11; 373/60; 323/212, 352, 208

[56] References Cited

U.S. PATENT DOCUMENTS 4,320,306  3/1982  Kohga et al. ............................ 307/51
4,403,327  9/1983  Granstrom et al. ..................... 373/80
5,809,054  9/1998  Oelscher ................................ 373/104

*Primary Examiner*—Marc S. Hoff
*Assistant Examiner*—Hien Vo
*Attorney, Agent, or Firm*—Burns, Doane, Swecker & Mathis, L.L.P.

[57] ABSTRACT

In low-power AC networks, it is desirable when a load is connected, for example an arc furnace or a vehicle, to know the load capacity of the AC network in order to avoid undesirable drops in the network voltage $U_N$. To this end, load voltage signals which are proportional to the amplitude of a load voltage $U_L$ are detected at the point of the load L at a 1st measurement time which can be predetermined and at a 2nd measurement time which can be predetermined and is later. At the same time, load current signals are detected which are proportional to the amplitude of a load current $I_L$. Furthermore, a phase difference $\Delta\phi$ is determined, which is obtained with reference to the phase angle of the network voltage $U_N$ at the 1st measurement time. These measurements are used as the bases to calculate a magnitude of the network impedance of the AC network and the network phase angle $\phi_N$ between the network voltage $U_N$ and the network current. A maximum possible power $P_L$ of the load L can be calculated in accordance with $P_L = U_L^2 \cdot \cos\phi_N / Z_N$, where $Z_N$ = network impedance.

4 Claims, 1 Drawing Sheet

METHOD FOR DETERMINING THE LOAD CAPACITY OF AN AC NETWORK

BACKGROUND OF THE INVENTION

1. Field of the Invention

The invention is based on a method for determining the load capacity of an AC network as claimed in the preamble of patent claim 1.

2. Discussion of Background

In the preamble to patent claim 1, the invention refers to a prior art as is known from DE 4037531 A1. A method is described there for controlling rectifiers of converters for three-phase traction vehicles, in which the four-quadrant controllers in the converters are clocked with phase shifts. This reduces the overall effect on the feeding AC network of harmonics which occur when clocking a plurality of rectifiers.

In low-power electrical networks, the operation of electric railway vehicles is frequently made more difficult owing to the fact that stability problems occur in the overall network as a result of an interaction between vehicles, network impedances and substations. In such electrical networks, an increased power demand from a vehicle immediately results in an amplitude and phase change in the voltage for the other vehicles. Such stability and power matching problems at the fundamental frequency of, for example, 16⅔ Hz or 50 Hz frequently occur in countries where the population density is low and there is little industry.

DE 195 04 271 C1 proposes that the impedance of an AC network be measured by feeding a reactive current into the network and measuring the induced phase shift.

DE 41 29 261 C1 discloses a method for digital current regulation for a four-quadrant regulator in an AC network. The current regulating variable used in this case is a future current value which is predicted taking into account a phase angle of the network voltage.

The subject matter of DE-AS 1 088 152 is a device and a method for determining a network internal impedance. A network load impedance is periodically connected, and the complex network internal impedance is determined from the drop in the network voltage.

The relevant prior art furthermore refers to the book by U. Tietze and Ch. Schenk, Halbleiter-Schaltungstechnik [Semiconductor circuit technology], 10th Edition, Springer-Verlag 1993, pages 954–956, from which it is known for phase changes in an oscillating signal to be determined by coasting synchronization. The present invention makes use of this capability with regard to the detected network voltage.

SUMMARY OF THE INVENTION

Accordingly, one object of the invention as it is defined in patent claim 1 is to develop further a method for determining the load capacity of an AC network of the type mentioned initially, in such a way that the relevant effective impedance of the rest of the system (other vehicles, cables, substations) can be determined for a given variable load.

Advantageous refinements of the invention are defined in the dependent patent claims.

One advantage of the invention is that it is possible to use the impedance of the rest of the system to estimate the extent to which the AC network can be additionally loaded. This is possible on the basis of load change information, in which case only the amplitudes of the voltage, current and the change in the phase angle need be detected.

According to an advantageous refinement of the invention, the maximum possible load capacity of the AC network can be determined from the load.

In countries in which resistive operation with a power factor of unity is a firm requirement, the information obtained can be used to prevent instability and exceeding the maximum available power. In other countries, in particular those with very long cable lines or very low power networks, it is desirable to use the load, for example vehicles, in a secondary role as "rolling phase compensators". The cable inductances are intended to be compensated for by, for example, the vehicle acting as a supporting capacitor, in addition to the real power which it draws. In the past, since the network impedance could not be estimated and varies continuously as a result of the motion of one's own and other vehicles, rigidly set phase angles have been used for operation in such cases, for example with a power factor of 0.8 capacitive. Depending on the actual network situation, this is too much or too little, so that matching to the network promises an improvement here or could lead to new markets which cannot be handled at the moment owing to the low-power networks.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
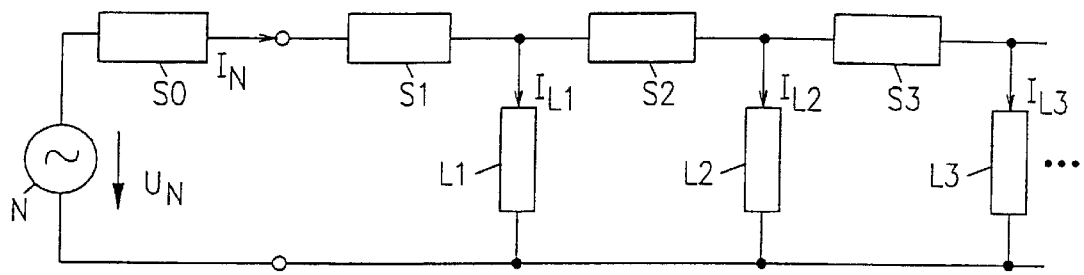
FIG. 1 shows an outline circuit diagram of an AC network having a plurality of loads according to the prior art connected to it.

Referring now to the drawings, wherein like reference numerals designate identical or corresponding parts throughout the several views, FIG. 1 shows an outline circuit diagram of an AC network having an AC voltage source N to which AC loads L1, L2, L3 are connected, and at which an AC voltage or a network voltage ($U_N$) can be tapped off. S0 denotes an impedance of the AC voltage source N, S1–S3 denote line impedances or line inductances, $I_N$ denotes an alternating current of the AC voltage source (N) or a network current, and $I_{L1}$–$I_{L3}$ denote alternating currents through the AC loads L1, L2, L3.

When further loads (which are not illustrated), for example arc furnaces or asynchronous machines in vehicles, are connected, it is possible for the AC voltage source N to be overloaded, which must be avoided. In order to identify this, the load capacity of the AC voltage source N must be determined.

Figure 2:
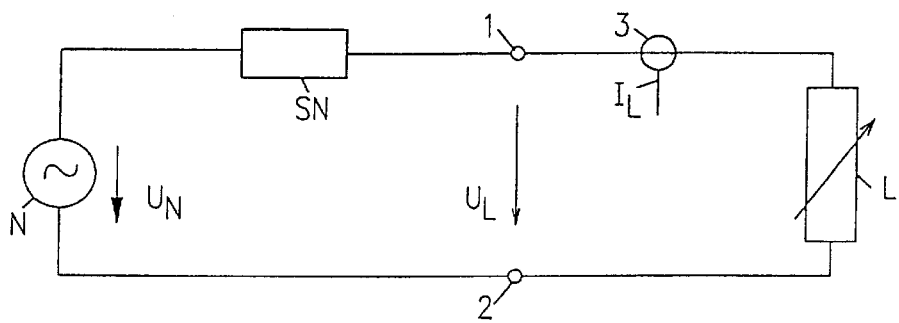
FIG. 2 shows an outline circuit diagram of an AC network having a load at the point of which the network impedance is to be determined.

FIG. 2 shows a variable AC load L which is connected via an ammeter (3) at network connection points 1, 2 to an AC network which is fed from the AC voltage source N and has an impedance or network impedance SN which is "seen" by the AC load L as the total impedance of the AC network. This total impedance may comprise a plurality of AC loads L1, L2, L3 according to FIG. 1. An AC voltage or load voltage $U_L$ can be tapped off at the network connection points 1, 2, and an alternating current or load current $I_L$ can be tapped off at the ammeter 3. The AC voltage source (N) supplies a network voltage $U_N$ whose amplitude can reduce as the load increases and which is at a frequency which can be predetermined and is, for example, 16⅔ Hz.

Figure 3:
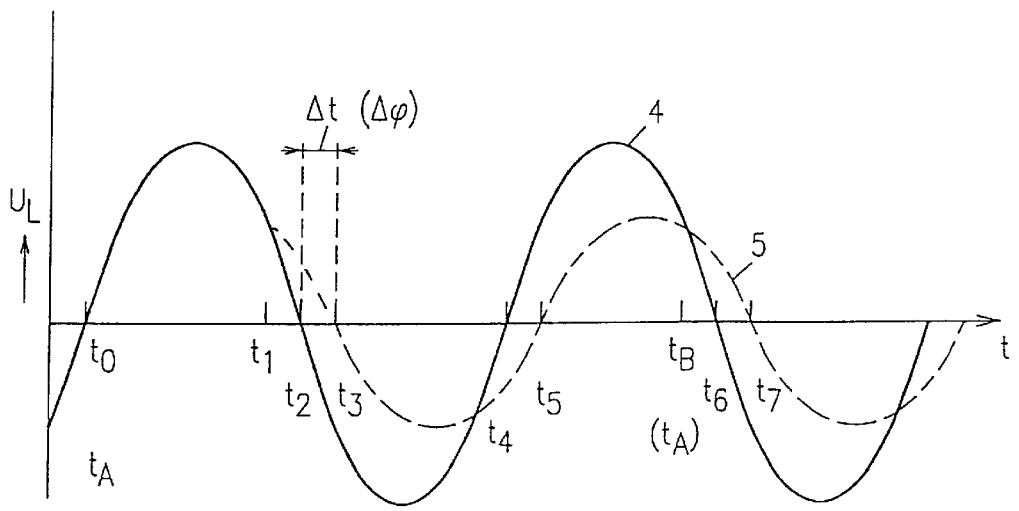
FIG. 3 shows a voltage/time diagram relating to FIG. 2, in order to explain the invention.

FIG. 3 shows, as a sinusoidal signal waveform 4, the signal profile with respect to time of a load voltage $U_L$ at the network connection points 1, 2 without any new load and, as a signal waveform 9 represented by a dashed line, the signal waveform with respect to time of this load voltage $U_L$ with a new load, which is connected to the AC network at a time $t1$. The load voltage $U_L$ is plotted on the ordinate, and a time $t$ on the abscissa. Without any new load, the load voltage $U_L$ according to the signal waveform 4 has voltage zeros at the times $t0$, $t2$, $t4$, $t6$ etc. Connection of a new load causes the amplitude of the load voltage $U_L$ to be reduced while, at the same time, its zeros are shifted in accordance with the signal waveform 5 to the times $t3$, $t5$, $t7$ etc. This time shift or time difference $\Delta t = t3-t2 = t5-t4 = t7-t6$ is detected using coasting synchronization (which was mentioned initially) between a 1st measurement time $t_A$ which can be predetermined and a 2nd measurement time $t_B$ which can be predetermined and is later; this corresponds to a phase shift, a phase change or a phase difference $\Delta\phi$.

At the same time, a 1st load voltage $U_{LA}$ and a 1st load current $I_{LA}$ are measured at the 1st measurement time $t_A$. At the same time, a 2nd load voltage $U_{LB}$ and a 2nd load current $I_{LB}$ are measured at the 2nd measurement time $t_B$. The time difference $t_B - t_A$ is chosen to be in the range from 1 ms to 1 s, a smaller value being better, but being limited by the computer speed. The AC load L may change by about 1%–20% in this time interval, which can occur in the case of vehicles due to braking or accelerating.

In order to determine the load capacity of the AC network, it is necessary to determine its impedance and/or a network impedance $\underline{Z}_N$ and a network phase angle $\phi_N$. In this case, vectorial, complex variables are shown underlined. Variables denoted in the same way but not underlined indicate amplitudes.

$\underline{U}_L = \underline{Z}_L \cdot \underline{I}_L$ and $\underline{U}_L = \underline{U}_N - \underline{Z}_N \cdot \underline{I}_L$ give:

$$\underline{U}_N = (1 + \underline{Z}_N/\underline{Z}_L) \cdot \underline{U}_L,$$

where $\underline{Z}_L$ is the load impedance.

On the assumption that the network voltage $U_N$ does not change significantly between the 1st measurement time $t_A$ and the 2nd measurement time $t_B$, then $\underline{U}_{NA} = \underline{U}_{NB}$ and, in consequence:

$$(1 + \underline{Z}_N/\underline{Z}_{LA}) \cdot \underline{U}_{LA} = (1 + \underline{Z}_N/\underline{Z}_{LB}) \cdot \underline{U}_{LB} \text{ and hence:}$$

$$\underline{Z}_N = -(\underline{U}_{LA} - \underline{U}_{LB})/(\underline{I}_{LA} - \underline{I}_{LB}).$$

In a polar coordinate representation, the equation obtained is as follows:

$$\underline{Z}_N = -(U_{LA} \cdot e^{j\varphi_A} - U_{LB} \cdot e^{j\varphi_B})/(I_{LA} \cdot e^{j\varphi_A} - I_{LB} \cdot e^{j\varphi_B})$$

$$= -[U_{LA} - U_{LB} \cdot e^{j(\varphi_B - \varphi_A)}]/[I_{LA} - I_{LB} \cdot e^{j(\varphi_B - \varphi_A)}]$$

where $\Delta\phi = \phi_B - \phi_A$.

The magnitude of the network impedance $\underline{Z}_N$ is obtained from:

$$Z_N = |\underline{Z}_N| = \{[(U_{LA} - U_{LB} \cdot \cos\Delta\phi)^2 + (U_{LB} \cdot \sin\Delta\phi)^2]/[(I_{LA} - I_{LB} \cdot \cos\Delta\phi)^2 + (I_{LB} \cdot \sin\Delta\phi)^2]\}^{0.5}$$

and the network phase angle $\phi_N$ is given by:

$$\phi_N = \pi + \arctan[-(U_{LB} \cdot \sin\Delta\phi)/(U_{LA} - U_{LB} \cdot \cos\Delta\phi)] - \arctan[(I_{LB} \cdot \sin\Delta\phi)/(I_{LA} - I_{LB} \cdot \cos\Delta\phi)].$$

The real power $P_L$ consumed in the AC load L is given by $$P_L = Re(\underline{U}_L \cdot \underline{I}_L^*) = Re(\underline{U}_L \cdot \underline{U}_L^*/\underline{Z}_L^*) = U_L^2 \cdot R_L/|\underline{Z}_L|^2,$$

where Re is the real part and $R_L$ the resistive element of the load impedance $\underline{Z}_L$ and * indicates a complex-conjugate variable.

For power matching, it can be said that:

$$\underline{Z}_L^* = \underline{Z}_N = Z_N \cdot \cos\phi_N + j \cdot Z_N \cdot \sin\phi_N.$$

The maximum possible power in the AC load L is thus:

$$P_L = U_L^2 \cdot \cos\phi_N/Z_N.$$

Using rectangular coordinates, the following formulae are obtained:

$$\underline{U}_{LA} = x_A + j \cdot y_A, \; \underline{U}_{LB} = x_B + j \cdot y_B,$$

$$\underline{I}_{LA} = p_A + j \cdot q_A, \; \underline{I}_{LB} = p_B + j \cdot q_B,$$

$$\underline{Z}_N = v + j \cdot w$$

and from this:

$$\underline{Z}_N = [(x_A - x_B) + j \cdot (y_A - y_B)/(p_A - p_B) + j \cdot (q_A - q_B)]$$

with the real part $$x_A - x_B = (p_A - p_B) \cdot v - (q_A - q_B) \cdot w$$

and the imaginary part $$y_A - y_B = (q_A - q_B) \cdot v + (p_A - p_B) \cdot w;$$

which give the following expressions:

$$v = -[(p_A - p_B) \cdot (x_A - x_B) + (q_A - q_B) \cdot (y_A - y_B)]/[(p_A - p_B)^2 + (q_A - q_B)^2]$$

and $$w = [(q_A - q_B) \cdot (x_A - x_B) - (p_A - p_B) \cdot (y_A - y_B)]/[(p_A - p_B)^2 + (q_A - q_B)^2],$$

where:

$$Z_N = (v^2 + w^2)^{0.5} \text{ and } \phi_N = \arctan(w/v).$$

This representation using rectangular coordinates is more suitable for a practical application than the representation in polar coordinates.

Once the 2nd measurement time $t_B$ has been detected, it can be used as the 1st measurement time $t_A$ for the next measurement. Voltages and currents can also be detected on a DC intermediate circuit in a converter (which is not illustrated) for feeding machines, as a DC voltage and direct current. The important factors are that the voltages and currents are detected at two different times and that the phase difference $\Delta\phi$ in this time interval of a frequency signal which is proportional to the network voltage $U_N$ is detected.

When applied to vehicles, the present invention makes it possible to determine, in all conditions:

the maximum power available for each vehicle,
the minimum total power, and
the maximum possible stability of the AC network.

The strategic aim for each vehicle should be:

to match the load impedance $\underline{Z}_L$ to that of the AC network, and not to exceed the maximum possible power $P_L$ of the AC load L.

Obviously, numerous modifications and variations of the present invention are possible, in light of the above teachings. It is therefore to be understood that, within the scope of the appended claims, the invention may be practiced otherwise than as specifically described herein.

What is claimed as new and desired to be secured by Letters Patent of the United States is:

1. A method for determining the load capacity of an AC network at the point of an electrical load (L), a) which is fed from the AC network,
    b) wherein at a 1st measurement time $t_A$ which can be predetermined and
    c) wherein at a 2nd measurement time $t_B$ which can be predetermined and is later
    d) wherein load voltage signals $U_{LA}$ and $U_{LB}$ which are proportional to the amplitude of a load voltage ($U_L$) are detected,
    e) wherein, at the same time and furthermore, load current signals $I_{LA}$ and $I_{LB}$ which are proportional to the amplitude of a load current ($I_L$) are detected, the indices A and B relating to detection at the 1st measurement time $t_A$ and at the 2nd measurement time $t_B$, respectively,
    f) wherein, at the 2nd measurement time $t_B$, a phase difference $\Delta\phi$ is detected from a signal which is proportional to the network voltage ($U_N$), which phase difference $\Delta\phi$ is obtained with reference to the phase angle of the network voltage ($U_N$) at the 1st measurement time $t_A$,
    g) wherein a magnitude of the network impedance $\underline{Z}_N$ of the AC network is formed at least approximately in accordance with:

$$|\underline{Z}_N| = \{[(U_{LA}-U_{LB}\cos\Delta\phi)^2+(U_{LB}\sin\Delta\phi)^2]/[(I_{LA}-I_{LB}\cos\Delta\phi)^2+(I_{LB}\sin\Delta\phi)^2]\}^{0.5}$$

or h)

$$|\underline{Z}_N|=|-[(x_A-x_B)+j\cdot(y_A-y_B)/(p_A-p_B+j\cdot(q_A-q_B)]|$$

and i) wherein a network phase angle $\phi_N$ between the network voltage ($U_N$) and the network current ($I_N$) is formed at least approximately in accordance with:

$$\varphi_N = \pi + \arctan[-(U_{LB}\cdot\sin\Delta\varphi)/(U_{LA}-U_{LB}\cdot\cos\Delta\varphi)] - \arctan[-(I_{LB}\cdot\sin\Delta\varphi)/(I_{LA}-I_{LB}\cdot\cos\Delta\varphi)]$$

or j)

$$\phi_N = \arctan(w/v)$$

where $$v=-[(p_A-p_B)\cdot(x_A-x_B)+(q_A-q_B)\cdot(y_A-y_B)]/[(p_A-p_B)^2+(q_A-q_B)^2],$$

$$w=[(q_A-q_B)\cdot(x_A-x_B)-(p_A-p_B)\cdot(y_A-y_B)]/[(p_A-p_B)^2+(q_A-q_B)^2],$$

$$\underline{U}_{LA}=x_A+j\cdot y_A,$$

$$\underline{U}_{LB}=x_B+j\cdot y_B, \underline{I}_{LA}=p_A+j\cdot q_A$$

and $$\underline{I}_{LB}=p_B+j\cdot q_B.$$

2. The method as claimed in claim 1, wherein a maximum possible power $P_L$ of the load (L) is formed in accordance with:

$$P_L=U_L^2\cdot\cos\phi_N/Z_N.$$

3. The method as claimed in claim 1,
    a) wherein the load voltage ($U_L$) is an AC voltage and
    b) wherein the load current ($I_L$) is an alternating current.

4. The method as claimed in claim 1, wherein the load (L) comprises at least one machine in a vehicle.

* * * * *